United States Patent
Doyle et al.

(10) Patent No.: US 7,193,279 B2
(45) Date of Patent: Mar. 20, 2007

(54) NON-PLANAR MOS STRUCTURE WITH A STRAINED CHANNEL REGION

(75) Inventors: Brian S. Doyle, Portland, OR (US); Suman Datta, Beaverton, OR (US); Been-Yih Jin, Beaverton, OR (US); Robert Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/039,197

(22) Filed: Jan. 18, 2005

(65) Prior Publication Data

US 2006/0157687 A1 Jul. 20, 2006

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/401; 257/19; 257/288; 257/328; 257/331; 257/618; 257/623

(58) Field of Classification Search .............. 257/19, 257/288, 328, 331, 401, 618, 623
See application file for complete search history.

(56) References Cited

U.S. PATENT DOCUMENTS

| | | |
|---|---|---|
| 5,124,777 A | 6/1992 | Lee |
| 5,338,959 A | 8/1994 | Kim et al. |
| 5,346,839 A | 9/1994 | Sundaresan |
| 5,466,621 A | 11/1995 | Hisamoto et al. |
| 5,545,586 A | 8/1996 | Koh |
| 5,563,077 A | 10/1996 | Ha |
| 5,578,513 A | 11/1996 | Maegawa |
| 5,658,806 A | 8/1997 | Lin et al. |
| 5,701,016 A | 12/1997 | Burroughs et al. |
| 5,716,879 A | 2/1998 | Choi et al. |
| 5,827,769 A | 10/1998 | Aminzadeh et al. |
| 5,905,285 A | 5/1999 | Gardner et al. |

(Continued)

FOREIGN PATENT DOCUMENTS

EP        0623963        11/1994

(Continued)

OTHER PUBLICATIONS

Jing Guo, et al. "Performance Projections for Ballistic Carbon Nanotube Field-Effect Transistors", Appiled Physics Letters, vol. 80, No. 17, pp. 3192-3194 (Apr. 29, 2004).

(Continued)

*Primary Examiner*—Ida M. Soward
(74) *Attorney, Agent, or Firm*—Blakely, Sokoloff, Taylor & Zafman LLP (57) ABSTRACT

An embodiment is a non-planar MOS transistor structure including a strained channel region. The combination of a non-planar MOS transistor structure, and in particular an NMOS tri-gate transistor, with the benefits of a strained channel yields improved transistor drive current, switching speed, and decreased leakage current for a given gate length width versus a non-planar MOS structure with an unstrained channel or planar MOS structure including a strained channel.

23 Claims, 9 Drawing Sheets

U.S. PATENT DOCUMENTS

| | | | |
|---|---|---|---|
| 6,251,751 B1* | 6/2001 | Chu et al. | 438/439 |
| 6,252,284 B1 | 6/2001 | Muller et al. | |
| 6,376,317 B1 | 4/2002 | Forbes et al. | |
| 6,396,108 B1 | 5/2002 | Krivokapic et al. | |
| 6,413,802 B1 | 7/2002 | Hu et al. | |
| 6,475,869 B1 | 11/2002 | Yu | |
| 6,475,890 B1 | 11/2002 | Yu | |
| 6,483,156 B1 | 11/2002 | Adkisson et al. | |
| 6,525,403 B2 | 2/2003 | Inaba et al. | |
| 6,562,665 B1 | 5/2003 | Yu | |
| 6,611,029 B1 | 8/2003 | Ahmed et al. | |
| 6,635,909 B2 | 10/2003 | Clark et al. | |
| 6,645,797 B1 | 11/2003 | Buynoski et al. | |
| 6,680,240 B1 | 1/2004 | Maszara | |
| 6,706,571 B1 | 3/2004 | Yu et al. | |
| 6,709,982 B1 | 3/2004 | Buynoski et al. | |
| 6,716,684 B1 | 4/2004 | Krivokapic et al. | |
| 6,716,690 B1 | 4/2004 | Wang et al. | |
| 6,730,964 B2 | 5/2004 | Horiuchi | |
| 6,756,657 B1 | 6/2004 | Zhang et al. | |
| 6,764,884 B1 | 7/2004 | Yu et al. | |
| 6,774,390 B2* | 8/2004 | Sugiyama et al. | 257/19 |
| 6,835,618 B1 | 12/2004 | Dakshina-Murthy | |
| 6,838,322 B2* | 1/2005 | Pham et al. | 438/151 |
| 6,858,472 B2 | 2/2005 | Chau et al. | |
| 6,858,478 B2 | 2/2005 | Chau et al. | |
| 6,881,635 B1* | 4/2005 | Chidambarrao et al. | 438/300 |
| 6,884,154 B2 | 4/2005 | Mizushima et al. | |
| 6,921,982 B2 | 7/2005 | Joshi et al. | |
| 6,955,969 B2* | 10/2005 | Djomehri et al. | 438/269 |
| 2002/0011612 A1 | 1/2002 | Hieda | |
| 2002/0036290 A1 | 3/2002 | Inaba et al. | |
| 2002/0081794 A1 | 6/2002 | Ito | |
| 2002/0166536 A1 | 11/2002 | Nagarajan | |
| 2002/0167007 A1 | 11/2002 | Masahiko et al. | |
| 2003/0057486 A1 | 3/2003 | Gambino et al. | |
| 2003/0085194 A1 | 5/2003 | Hopkins, Jr. | |
| 2003/0098488 A1 | 5/2003 | O'Keeffe et al. | |
| 2003/0102497 A1 | 6/2003 | Fried et al. | |
| 2003/0111686 A1 | 6/2003 | Nowak | |
| 2003/0122186 A1 | 7/2003 | Sekigawa et al. | |
| 2003/0143791 A1 | 7/2003 | Cheong et al. | |
| 2003/0151077 A1 | 8/2003 | Mathew et al. | |
| 2003/0201458 A1* | 10/2003 | Clark et al. | 257/192 |
| 2003/0227036 A1 | 12/2003 | Sugiyama et al. | |
| 2004/0031979 A1 | 2/2004 | Lochtefeld et al. | |
| 2004/0036118 A1 | 2/2004 | Adadeer et al. | |
| 2004/0036127 A1 | 2/2004 | Chau et al. | |
| 2004/0061178 A1 | 4/2004 | Lin-Ming-Ren et al. | |
| 2004/0092062 A1 | 5/2004 | Ahmed et al. | |
| 2004/0092067 A1 | 5/2004 | Hanafi et al. | |
| 2004/0094807 A1 | 5/2004 | Chau et al. | |
| 2004/0099903 A1* | 5/2004 | Yeo et al. | 257/317 |
| 2004/0110097 A1 | 6/2004 | Ahmed et al. | |
| 2004/0119100 A1 | 6/2004 | Nowal et al. | |
| 2004/0126975 A1 | 7/2004 | Ahmed et al. | |
| 2004/0145019 A1 | 7/2004 | Dakshina-Murthy et al. | |
| 2004/0166642 A1 | 8/2004 | Chen et al. | |
| 2004/0180491 A1 | 9/2004 | Arai et al. | |
| 2004/0191980 A1 | 9/2004 | Rios et al. | |
| 2004/0195624 A1* | 10/2004 | Liu et al. | 257/347 |
| 2004/0197975 A1* | 10/2004 | Krivokapic et al. | 438/200 |
| 2004/0198003 A1 | 10/2004 | Yeo et al. | |
| 2004/0227187 A1 | 11/2004 | Cheng et al. | |
| 2004/0238887 A1 | 12/2004 | Nihey | |
| 2004/0253792 A1* | 12/2004 | Cohen et al. | 438/400 |
| 2004/0256647 A1 | 12/2004 | Lee et al. | |
| 2004/0262683 A1 | 12/2004 | Nihey | |
| 2004/0262699 A1 | 12/2004 | Rios et al. | |
| 2005/0093067 A1* | 5/2005 | Yeo et al. | 257/348 |
| 2005/0093154 A1* | 5/2005 | Kottantharayil et al. | 257/745 |
| 2005/0118790 A1 | 6/2005 | Lee et al. | |
| 2005/0127362 A1 | 6/2005 | Zhang et al. | |
| 2005/0145941 A1* | 7/2005 | Bedell et al. | 257/348 |
| 2005/0156202 A1* | 7/2005 | Rhee et al. | 257/213 |
| 2005/0184316 A1* | 8/2005 | Kim et al. | 257/213 |
| 2005/0191795 A1* | 9/2005 | Chidambarrao et al. | 438/142 |
| 2005/0224797 A1 | 10/2005 | Ko et al. | |
| 2005/0224798 A1* | 10/2005 | Buss | 257/65 |
| 2005/0224800 A1* | 10/2005 | Lindert et al. | 257/66 |
| 2005/0227498 A1* | 10/2005 | Furukawa et al. | 438/758 |
| 2005/0230763 A1* | 10/2005 | Huang et al. | 257/374 |
| 2006/0014338 A1* | 1/2006 | Doris et al. | 438/197 |
| 2006/0138548 A1* | 6/2006 | Richards et al. | 257/368 |

FOREIGN PATENT DOCUMENTS

| | | |
|---|---|---|
| EP | 1 202 335 A | 5/2002 |
| EP | 1 566 844 A2 | 8/2005 |
| JP | 2002298051 | 10/2003 |
| WO | WO 02/43151 | 5/2002 |
| WO | WO 2004/059726 A1 | 7/2004 |

OTHER PUBLICATIONS

Ali Javey, et al., "High-K Dielectrics for Advanced Carbon-Nanotube Transistors and Logic Gates", Advance Online Publication, Published online, pp. 1-6 (Nov. 17, 2002).

Richard Martel, et al., "Carbon Nanotube Field Effect Transistors for Logic Applications" IBM, T.J. Watson Research Center, 2001 IEEE, IEDM 01, pp. 159-162.

David M. Fried, et al., "High-Performance P-Type Independent-Gate FinFETs, IEEE Electron Device Letters", vol. 25, No. 4, Apr. 2004, pp. 199-201.

David M. Fried, et al., "Improved Independent Gate N-Type FinFET Fabrication and Characterization", IEEE Electron Device Letters, vol. 24, No. 9, Sep. 2003, pp. 592-594.

Charles Kuo, et al. "A Capacitorless Double Gate DRAM Technology for Sub-100-nm Embedded and Stand-Alone Memory Applications", IEEE Transactions on Electron Devices, vol. 50, No. 12, Dec. 2003, pp. 2408-2416.

Charles Kuo, et al., "A Capacitorless Double-Gate DRAM Cell Design for High Density Applications", 2002 IEEE International Electron Devices Meeting Technical Digest, Dec. 2002, pp. 843-846.

Takashi Ohsawa, et al., "Memory Design Using a One-Transistor Gain Cell on SOI", IEEE Journal of Solid-State Circuits, vol. 37, No. 11, Nov. 2002, pp. 1510-1522.

T. Tanaka, et al., "Scalability Study on a Capacitorless 1T-DRAM: From Single-Gate PD-SOI to Double Gate FinDRAM", 2004 IEEE International Electron Devices Meeting Technical Digest, Dec. 2004, 4 pages.

T. M. Mayer, et al., "Chemical Vapor Deposition of Fluoroalkylsilane Monolayer Films for Adhesion Control in Microelectromechanical Systems" 2000 American Vacuum Society B 18(5), Sep./Oct. 2000, pp. 2433-2440.

International Search Report PCT/US2005/000947, Int'l. filing date Jan. 10, 2005, mailed May 3, 2005 (7 pages).

T. Park et al., "Fabrication of Body-Tied FinFETs (Omega MOSFETS) Using Bulk Si Wafers", 2003 Symposia on VLSI Technology Digest of Technical Papers, Jun. 2003, pp. 135-136.

Burenkov, A. et al., "Corner Effect Double and Triple Gate FINFETs", European Solid-State Device Research, 2003 33rd Conference on Essderc '03 Sep. 2003, Piscataway, NJ, USA, IEEE, pp. 135-138, XP010676716.

Chang, S.T. et al, "3-D Simulation of Strained Si/SiGe Heterojunction FinFETS", Semiconductor Device Research Symposium, 2003 International, Dec. 2003, Piscataway, NJ, USA, IEEE, pp. 176-177, XP010687197.

Subramanian et al, "A Bulk Si-Compatible Ultrathin-Body SOI Technology for Sub- 100nm MOSFETS", Proceedings of the 57th Annual Device REach Conference, pp. 28-29 (1999).

Hisamoto et al, "A Folded-Channel MOSFET for Deepsub-tenth Micron ERa", 1998 IEEE International Electron Device Meeting Technical Digest, pp. 1032-1034 (1998).

Huang et al, "Sub 50 nm FinFet: PMOS", 1999 IEEE International Electron Device Meeting Technical Digests, pp. 67-70 (1990).

Auth et al, "Vertical, Fully-Depleted, Surroundings Gate MOSFETS on Sub 0.1um Thick Silicon Pillars", 1996 54th Annual Device Research Conference Digest, pp. 108-109, (1996).

Hisamoto et al, "A Fully Depleted Lean-Channel Transistor (DELTA)-A Novel Vertical Ultrathin SOI Mosfet" IEEE Electron Device Letters, vol. 11(1), pp. 36-38 (1990).

Park et al, "Pi-Gate SOI MOSFET" IEEE Electron Device Letters, vol. 22, No. 8, Aug. 2001, pp. 405-406.

Digh et al, "FinFet—A Self Aligned Double-Gate MOSFET Scalable to 20ne", IEEE Transactions on Electron Devices, vol. 47, No. 12, Dec. 2000, pp. 2320-2325.

Park et al, "Fabrication of Body-Find FinFETs (Omega MOSFETS) Using Bulk Si Wafers", 2003 Symposia on VLSI Technology Digest of Technical Papers, Jun. 2003, pp. 135-136.

International Search Report for PCT Application No. PCT/US2006/000378, Mailed May 24, 2006, 5 pgs.

International Written Opinion for PCT Application No. PCT/US2006/000378, Mailed May 24, 2006, 6 pgs.

International Search Report PCT/US2005/033439, mailed Jan. 31, 2006 (7 pgs.).

International Search Report PCT/US2005/035380, mailed Feb. 13, 2006 (14 pgs.).

International Search Report PCT/US2005/037169, mailed Feb. 23, 2006 (11 pgs.).

Sung Min Kim, et al., A Novel Multi-channel Field Effect Transistr (McFET) on Bulk Si for High Performance Sub-80nm Application, IEDM 04-639, 2004 IEEE, pp. 27.4.1-27.4.4.

Yang-Kyu Choi, et al., "A Spacer Patterning Technology for Nanoscale CMOS" IEEE Transactions on Electron Devices, vol. 49, No. 3, Mar. 2002, pp. 436-441.

W. Xiong, et al., "Corner Effect in Multiple-Gate SOI MOSFETs" 2003 IEEE, pp. 111-113.

Weize Xiong, et al., "Improvement of FinFET Electrical Characteristics by Hydrogen Annealing" IEEE Electron Device Letters, vol. 25, No. 8, Aug. 2004, XP-001198998, pp. 541-543.

Fu-Liang Yang, et al., "5nm-Gate Nanowire FinFET" 2004 Symposium on VLSI Technology Digest of Technical Papers, 2004 IEEE, pp. 196-197.

* cited by examiner

NON-PLANAR MOS STRUCTURE WITH A STRAINED CHANNEL REGION

FIELD

Embodiments of the invention relate to a transistor structure and in particular to a non-planar transistor structure that incorporates a strained channel.

BACKGROUND

Traditional planar metal oxide semiconductor (MOS) transistor technology is approaching fundamental physical limits for certain transistor features past which it will be necessary to employ alternate materials, processing techniques, and/or transistor structure to support continued transistor performance improvement according to Moore's Law.

One such paradigm shift is a non-planar MOS structure. One particular non-planar MOS structure is a non-planar tri-gate transistor. A tri-gate transistor employs a three-dimensional gate structure that permits electrical signals to conduct along the top of the transistor gate and along both vertical sidewalls of the gate. The conduction along three sides of the gates enables, among other improvements, higher drive currents, faster switching speeds, and shorter gate lengths, simultaneously increasing the performance of the transistor while occupying less substrate area versus a planar MOS structure. The tri-gate structure further decreases the amount of current leakage, a problem to which ever shrinking planar MOS devices are prone, by improving the short channel characteristics of the transistor.

Another paradigm shift involves using strained semiconductor material for various portions of a transistor. Adding tensile or compressive strain to a semiconductor (depending on the particular application) lattice increases the carrier mobility within the strained semiconductor. In particular, for an NMOS device imparting tensile strain to a semiconductor increases the electron mobility (i.e., dominant charge carrier in an NMOS device). The increased carrier mobility in turn allows for higher drive current and corresponding faster switching speeds.

DETAILED DESCRIPTION

Embodiments of a non-planar MOS transistor structure with a strained channel region will be described. Reference will now be made in detail to a description of these embodiments as illustrated in the drawings. While the embodiments will be described in connection with these drawings, there is no intent to limit them to drawings disclosed herein. On the contrary, the intent is to cover all alternatives, modifications, and equivalents within the spirit and scope of the described embodiments as defined by the accompanying claims.

Simply stated, an embodiment is a non-planar MOS transistor structure including a strained channel region. The combination of a non-planar MOS transistor structure, and in particular an NMOS tri-gate transistor, with the benefits of a strained channel yields improved transistor drive current, switching speed, and decreased leakage current for a given gate length, gate width, and operating voltage versus a non-planar MOS structure with an unstrained channel or planar MOS structure including a strained channel.

Figure 1:
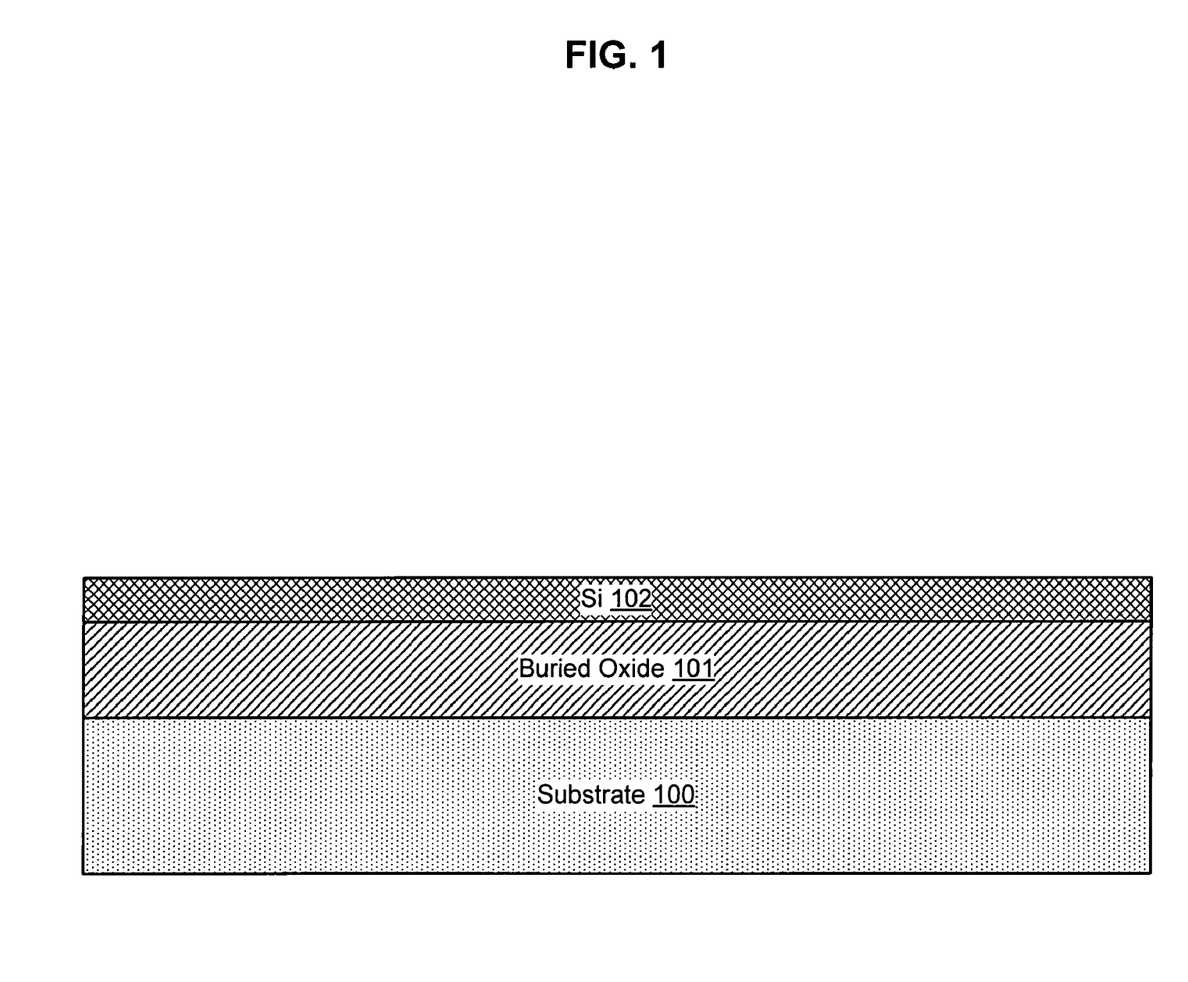
FIG. 1: illustration of cross section of a silicon on insulator (SOI) substrate

FIG. 1 illustrates a cross section of a silicon on insulator (SOI) substrate. SOI substrates are well known in the art to increase transistor performance by, among other features, reducing the capacitance that develops in a junction capacitance layer between impurity layers (e.g., impurity doped source and drain regions of a planar MOS structure) and a substrate. For example, in an embodiment, substrate 100 comprises silicon. Atop substrate 100 is a buried oxide 101. In an embodiment, the buried oxide comprises silicon dioxide. Atop the buried oxide 101 is silicon 102. Commercially available, the SOI substrates generally include silicon 102 layers that are approximately 500 angstroms thick. An embodiment, to further reduce the junction capacitance area, planarizes and polishes (e.g., by chemical mechanical polishing or CMP) the silicon 102 to approximately between 20 and 100 angstroms. It is to be understood, however, that the SOI combination of substrate 100, buried oxide 101 and silicon 102 may also be prepared by separation by implanted oxygen (SIMOX), bonded and etched back (BESOI) or hydrogen implant before BESOI process (Smart Cut) as is understood in the art.

Figure 2:
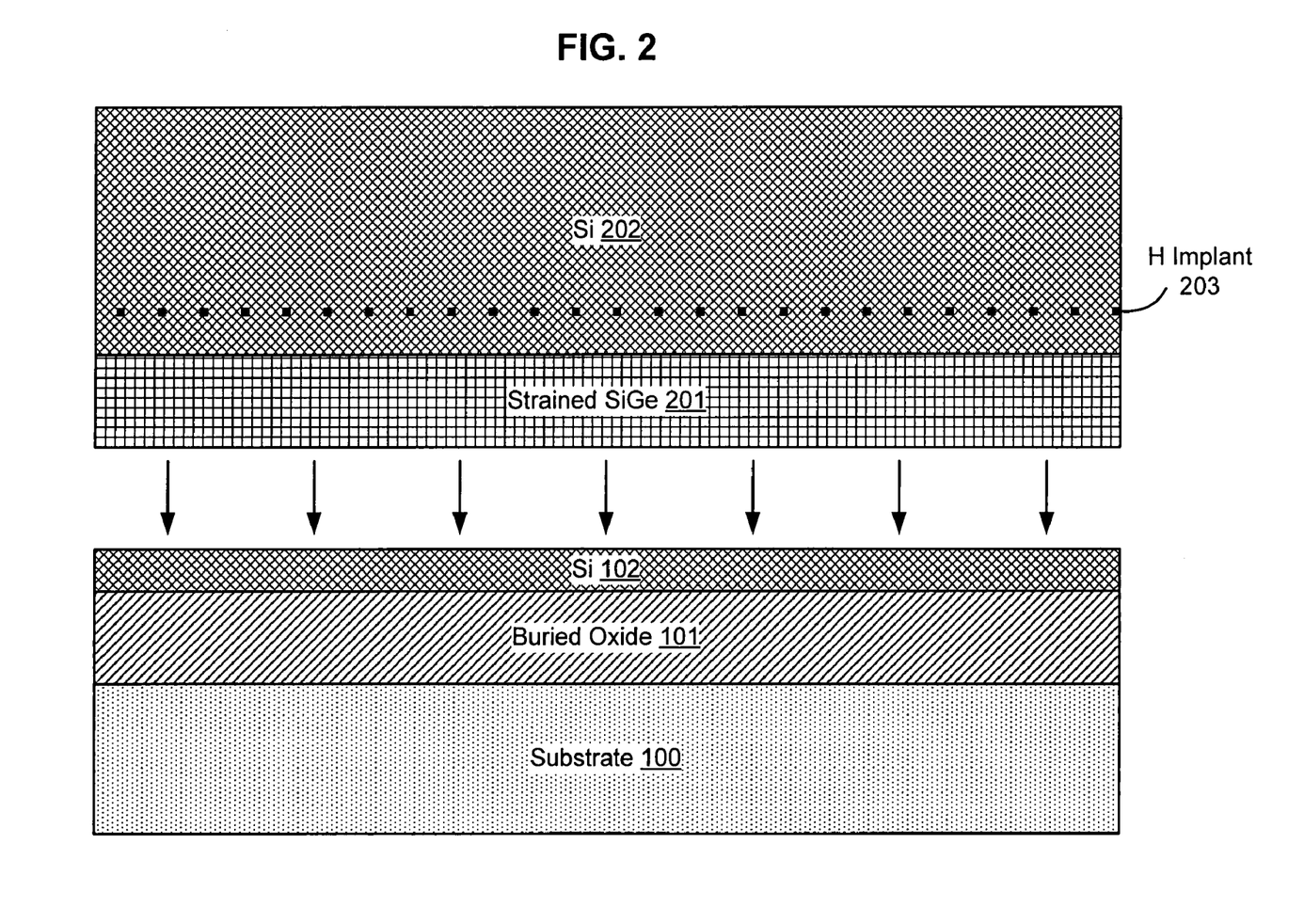
FIG. 2: illustration of the substrate of FIG. 1 and strained silicon germanium and silicon with a hydrogen implant for Smart Cut process

FIG. 2 illustrates the substrate 100 cross section of FIG. 1 including strained silicon germanium 201 and silicon 202 prior to Smart Cut transfer of each to silicon 201 as is well known in the art and has been developed by SOITEC. A particular application of the Smart Cut method involves growing a layer of strained silicon germanium 201 on silicon 202 as a separate substrate that includes a large sacrificial silicon 202 layer as illustrated by FIG. 2. A high dose (i.e., $10^{17}/cm^2$) of hydrogen is implanted to a depth either in the silicon 202 adjacent to the strained silicon germanium 201 or to a depth within the silicon germanium layer 201 as illustrated by hydrogen implant 203 (shown deposited within silicon 202). The separate substrate comprised of silicon 202 and strained silicon germanium 201 is brought into contact with the substrate 100 that includes buried oxide 101 and silicon 102. In particular, the surfaces of silicon 102 and strained silicon germanium 201 are joined by chemical hydrophobic bonding after a high temperature anneal. Said differently, the strained silicon germanium 201 bonds by covalent forces to the silicon 102. In an embodiment, the anneal is approximately between 800° C. and 900° C. for approximately 1 hour. The anneal further produces, based on the high dose hydrogen implant 203 in silicon 202, an in-depth weakened layer of silicon 202. As the bonding forces between the silicon 102 and strained silicon germanium 201 are stronger than what the in-depth hydrogen implant 203 weakened region of silicon 202 can support, the sacrificial portion of silicon 202 (or of silicon germanium 201 and silicon 202 if the hydrogen implant 203 resides in the silicon germanium 201) can be cleaved, leaving behind the structure illustrated by FIG. 3. In an embodiment, the remaining silicon 202 (or silicon germanium 201) may be chemically mechanically polished to form a suitable silicon 202 (or silicon germanium 201) surface for subsequent processing steps.

Silicon and germanium have the same lattice structure; however, the lattice constant of germanium is 4.2% greater than the lattice constant of germanium (the lattice constant of silicon is 5.43 angstroms while the lattice constant of germanium is 5.66 angstroms). A silicon germanium alloy $Si_{1-x}Ge_x$ x=0.0 to 1.0, has a monotonically increasing lattice constant a x increases from 0.0 to 1.0. Depositing a thin layer of silicon over silicon germanium produces, as the underlying silicon germanium lattice structure coerces the lattice thinly deposited layer of silicon, a silicon layer with tensile strain as the smaller silicon lattice aligns with the larger silicon germanium lattice. Similarly, a thin silicon germanium layer can be grown with compressive strain on a layer of silicon. However, as the deposited layers of strained materials thicken, they tend to relax to their intrinsic lattice structure.

Figure 3:
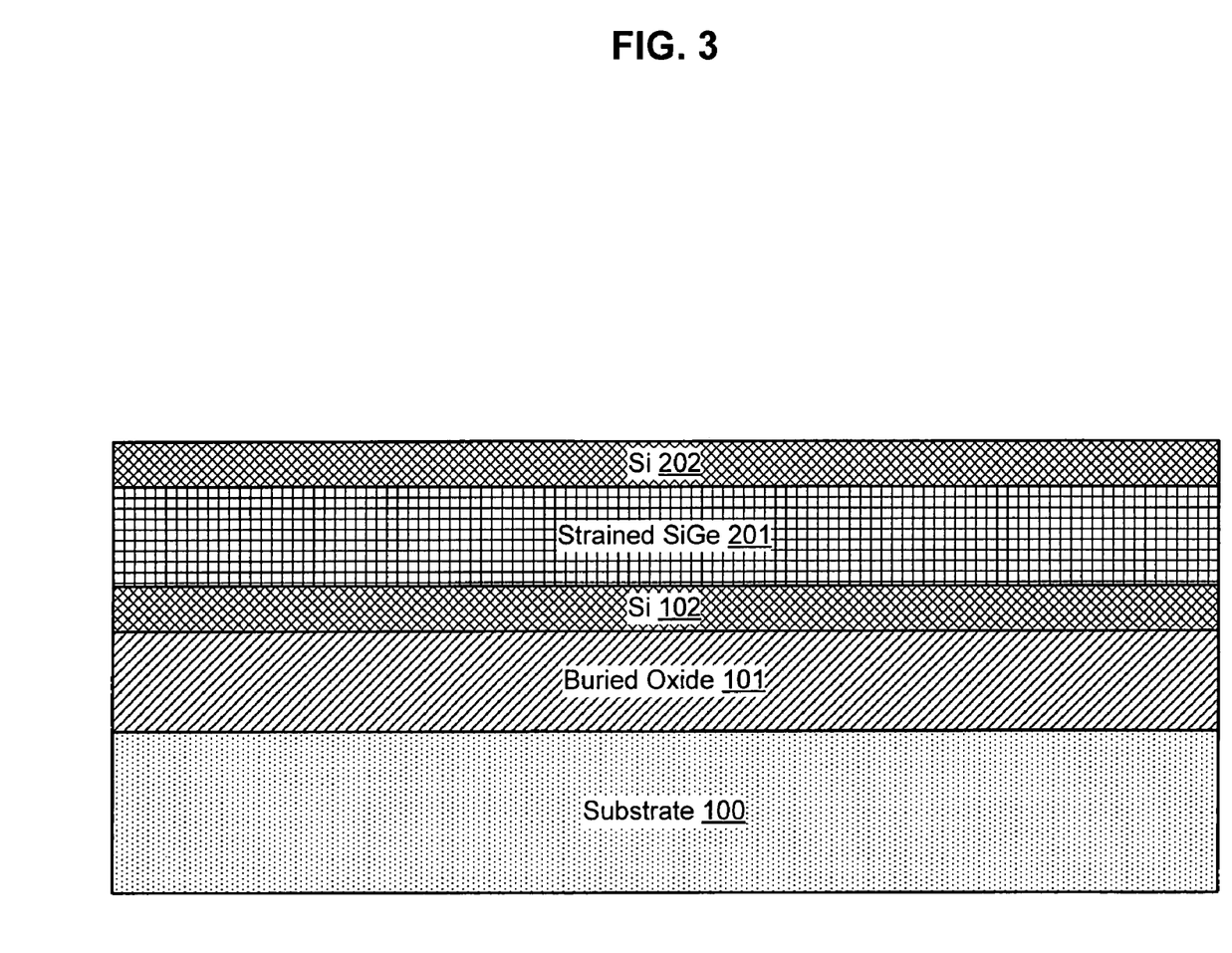
FIG. 3: illustration of a cross section of the substrate of FIG. 2 following the Smart Cut formation of strained silicon germanium and silicon
Figure 4:
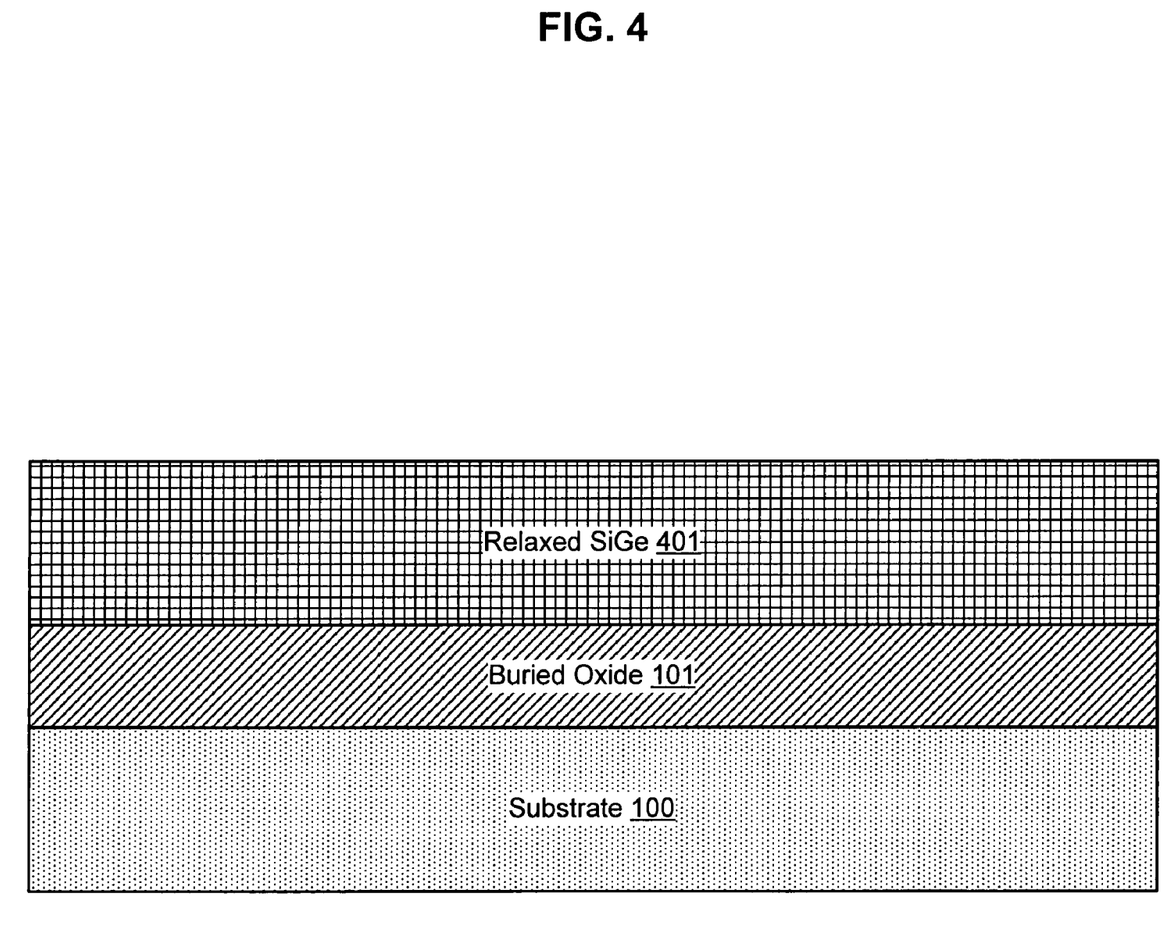
FIG. 4: illustration of a cross section of the substrate of FIG. 3 following an anneal to form relaxed silicon germanium

FIG. 4 illustrates the substrate 100 cross section of FIG. 3 following a high temperature, long duration anneal. In an embodiment, the anneal is approximately between 800° C. and 1100° C. for approximately 1 second to 3 hours. In an anneal of an embodiment, the temperature is approximately 1000° C. and the duration is approximately 2 hours. During the high temperature, long duration anneal, the germanium in the strained silicon germanium 201 diffuses into the silicon 102 and silicon 202. As the germanium diffuses to an approximate constant concentration throughout the strained silicon 201, silicon 102, and silicon 202, it forms relaxed silicon germanium 401. No longer compressively strained by adjacent silicon, the lattice constant of the relaxed silicon germanium 401 increases based on the germanium concentration in the relaxed silicon germanium 401. In an embodiment, the relaxed silicon germanium 401 has a germanium concentration range of approximately 5% to 80% (i.e., approximately 5% to 80% of the silicon lattice sites are occupied by germanium). In an embodiment, the relaxed silicon germanium 401 has a germanium concentration approximately 15%. The relaxed silicon germanium 401 may, based on the pre-anneal doping of silicon 102, strained silicon germanium 201, silicon 202, or a combination thereof (or in an embodiment, a separate relaxed silicon germanium 401 doping process) may be p-doped with any p-dopant known in the art. The p-dopant concentration level of a relaxed silicon germanium 401 embodiment may be approximately between undoped and $6*10^{19}/cm^3$. In an embodiment, the p-type dopant concentration level of relaxed silicon germanium 401 is approximately $10^{17}/cm^3$.

Figure 5:
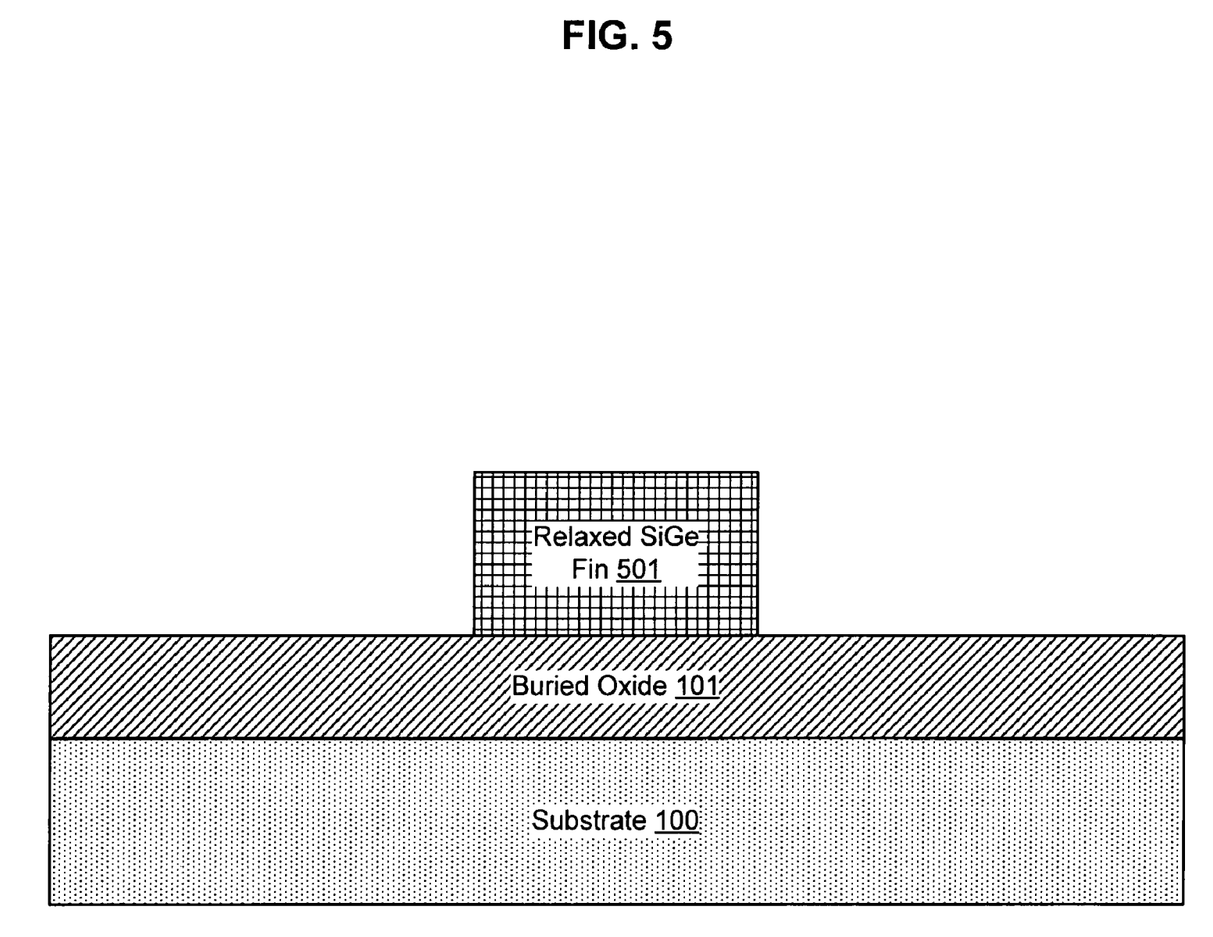
FIG. 5: illustration of a cross section of the substrate of FIG. 4 following the patterning of the relaxed silicon germanium

FIG. 5 illustrates a cross section of the substrate 100 of FIG. 4 following the lithographic patterning of the relaxed silicon germanium 401 to form a relaxed silicon germanium fin 501. The relaxed silicon germanium fin 501 may be patterned by any method known in the art to pattern silicon germanium. In an embodiment, the relaxed silicon germanium fin is patterned by any dry silicon etch process known in the art. Following the lithographic patterning, relaxed silicon germanium fin 501 of an embodiment has an approximately rectangular cross section as the lithographic patterning is substantially anisotropic and creates substantially vertical relaxed silicon germanium fin 501 sidewalls. In a further embodiment, though not illustrated, the relaxed silicon germanium fin 501 has a substantially trapezoidal cross section, with its top surface spanning a smaller lateral distance than its base adjacent to the buried oxide 101. For both the substantially rectangular and substantially trapezoidal embodiments, the relaxed silicon germanium fin 501 comprises a top and two sidewalls whose width and height dimensions are approximately between 25% and 100% of the transistor gate length, and can have any shape from substantially tall and thin to substantially short and wide. In yet further embodiments, also not illustrated, the relaxed silicon germanium fin 501 has other geometrical cross sections that may include additional sidewalls or may be substantially hemispherical.

Figure 6:
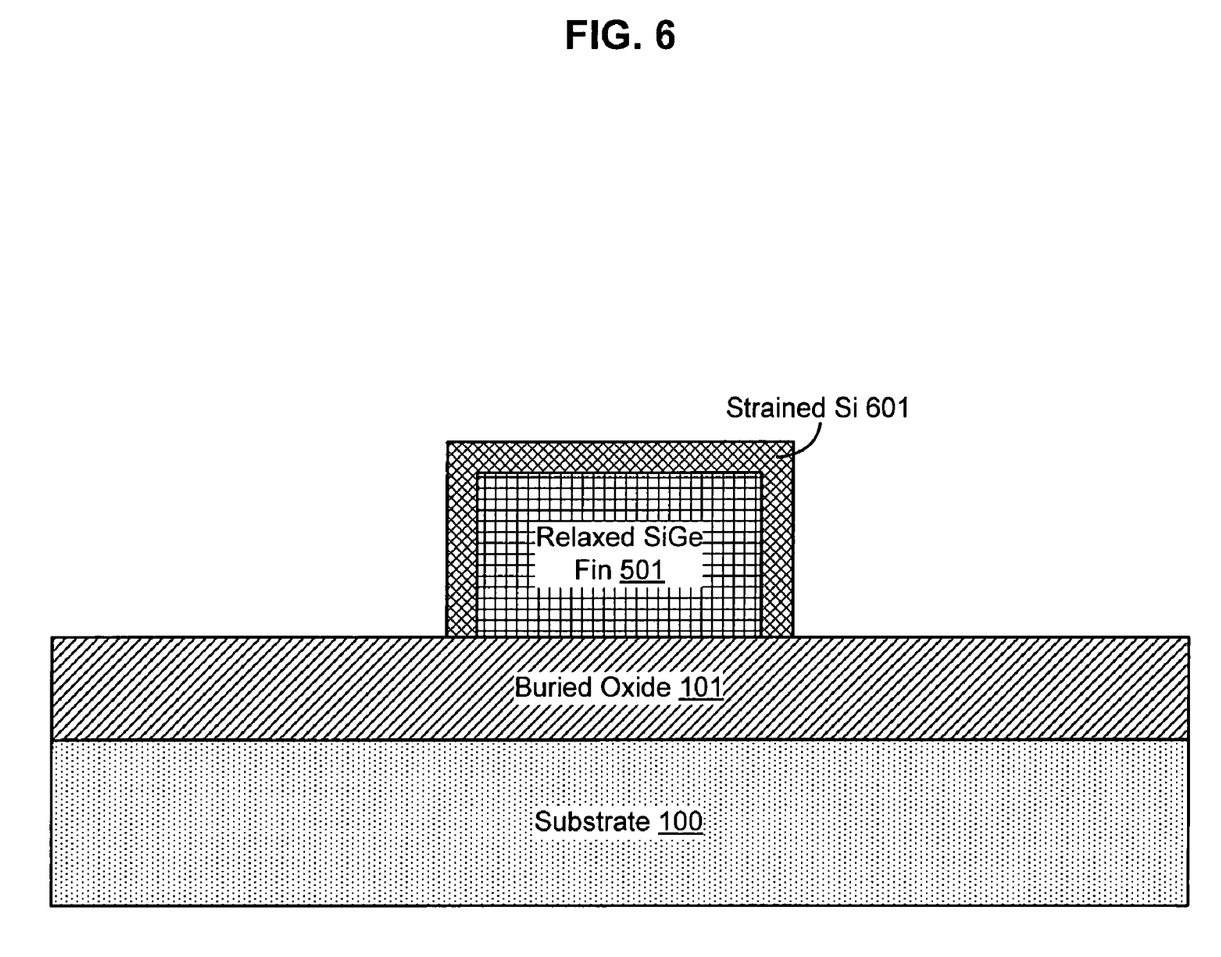
FIG. 6: illustration of a cross section of the substrate of FIG. 5 following the formation of strained silicon on the relaxed silicon germanium

FIG. 6 illustrates a cross section of the substrate 100 of FIG. 5 following the deposition of strained silicon 601. As noted above, the lattice constant of the relaxed silicon germanium fin 501 is larger than the lattice constant of silicon. When a thin layer of silicon is formed atop the relaxed silicon germanium fin 501, provided the silicon has a sufficiently small thickness, the silicon lattice will align with the relaxed silicon germanium fin 501 lattice to form strained silicon 601. As the relaxed silicon germanium fin 501 lattice constant is larger than that of silicon, the subsequently formed strained silicon 601 exhibits tensile strain as the smaller silicon lattice stretches to conform with the relaxed silicon germanium fin 501 lattice. As noted, the tensile strain increases the carrier mobility in the strained silicon 601 that comprises the channel region of a non-planar MOS transistor of an embodiment.

Strained silicon 601 can be deposited by any method known in the art to deposit crystalline silicon. In an embodiment, the strained silicon 601 is deposited with selective epitaxy such that the silicon grows only on the surface of the relaxed silicon germanium fin 401 and not on the surface of the buried oxide 101 exposed during the patterning of relaxed silicon germanium fin 501. For example, in an embodiment a low pressure chemical vapor deposition process of an embodiment utilizes silane ($SiH_4$), disilane ($Si_2H_4$), dichlorol silane ($SiH_2Cl_2$), and trichlorol silane ($SiHCl_3$) as a silicon source and HCL as an etching gas for selective growth. In an embodiment, the pressure of the deposition chamber is approximately between 500 millitorr and 500 torr, the temperature of the substrate 100 is approximately between 400° C. and 1100° C., and the total precursor gas flow rate is approximately between 10 sccm and 1000 sccm. It is to be understood that the deposition conditions may vary depending on the size of the deposition chamber. It is to be further understood that the epitaxial deposition forms substantially a single crystal stained silicon 601.

In an embodiment, the strained silicon 601 is doped with a p-type dopant. In an embodiment the p-type dopant concentration level of strained silicon 601 ranges from approximately undoped to $6*10^{19}/cm^3$. It is to be understood that the strained silicon 601 may be doped by any doping method known in the art. In particular, the strained silicon 601 may be doped in situ during its deposition by incorporating dopant precursors in the low pressure chemical deposition process of an embodiment. The strained silicon 601 may alternatively be doped by out diffusion or implant.

As noted, the cross section of the relaxed silicon germanium fin 501 of an embodiment has a top and two sidewalls. It is important to note that the strained silicon 601 be deposited on the top and on both sidewalls of relaxed silicon germanium fin 501 with substantially uniform thickness for each surface. The strained silicon 601 of an embodiment on the top and sidewalls has a substantially uniform thickness of approximately between 2 nanometers and 10 nanometers In an embodiment, the strained silicon 601 thickness is approximately between 4 and 5 nanometers. In an embodiment, the strained silicon 601 thickness permits deeply depleted or fully depleted channel conditions as is understood in the art.

Figure 7:
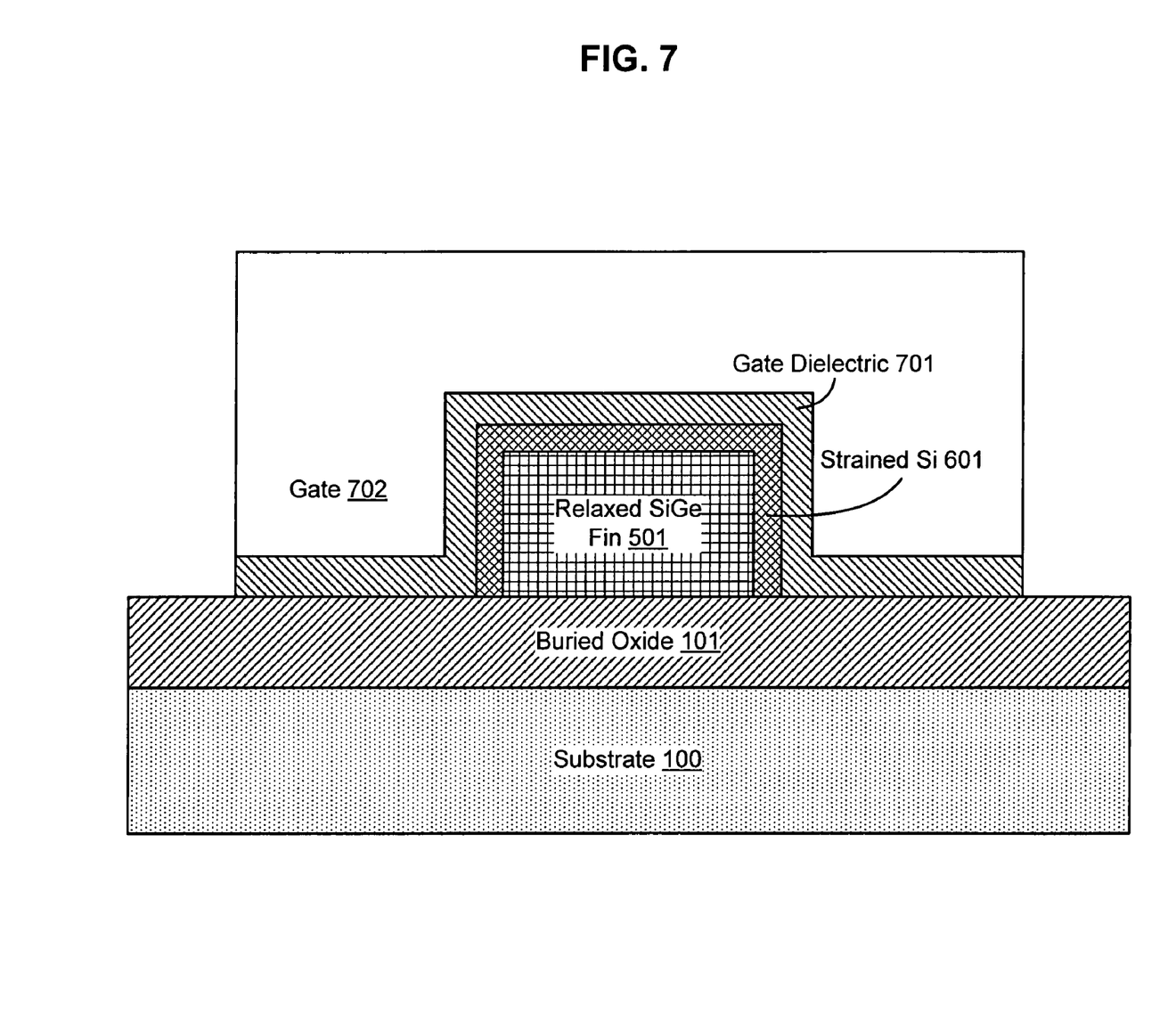
FIG. 7: illustration of a cross section of the substrate of FIG. 6 following the formation of a gate dielectric and gate to form a non-planar MOS structure including a strained channel

FIG. 7 illustrates a cross section of the substrate 100 of FIG. 6 following the deposition of a gate dielectric 701 and gate 702 to illustrate a non-planar, tri-gate transistor cross section. In an embodiment, gate dielectric 701 comprises silicon dioxide. In a further embodiment, gate dielectric 701 comprises a high dielectric constant material like hafnium oxide, hafnium silicate, lanthanum oxide, lanthanum aluminate, zirconium oxide, zirconium silicate, tantalum oxide, titanium oxide, barium strontium titanate, barium titanate, strontium titanate, yttrium oxide, aluminum oxide, lead scandium tantanate, or lead zinc niobate. The gate dielectric 701 may be deposited my any method known in the art to deposit a gate dielectric 701 material.

In an embodiment, the gate dielectric 701 deposition is a blanket deposition. Following the deposition of gate dielectric 701, a gate 702 is deposited. In an embodiment the gate 702 comprises polysilicon, polysilicon with a layer of metal at the high-k gate dielectric 701 interface, or a complete metal gate. In an embodiment, the gate 702 deposition is a blanket deposition. In an embodiment for which the gate dielectric 701 and gate 702 depositions are blanket depositions, each is etched to expose areas of strained silicon 601 that will thereafter form the source and drain of the tri-gate non-planar transistor of an embodiment. Of note is that the gate 702 and underlying gate dielectric 701 of an embodiment extend over all sides (in an embodiment, the top and both sidewalls) of the relaxed silicon germanium fin 501 including strained silicon 601 formed thereon.

In an alternate embodiment (not illustrated), the gate 702 is only adjacent to the sidewalls of the relaxed silicon germanium fin 501 and does not extend across the top of the relaxed silicon germanium fin 501. The strained silicon 601 may be formed over the entire exposed surface (i.e., top and both sidewalls) of the relaxed silicon germanium fin 501 or may just be formed on the two sidewalls of the silicon germanium fin 501. Similarly, the gate dielectric 701 may be formed over the entire exposed surface (i.e., top and both sidewalls) of the strained silicon 601 formed atop the relaxed silicon germanium fin 501 or may just be formed on the two sidewalls of strained silicon 601. With such an arrangement, the non-planar transistor of an embodiment resembles a FinFET including strained silicon 601 channel regions.

Figure 8:
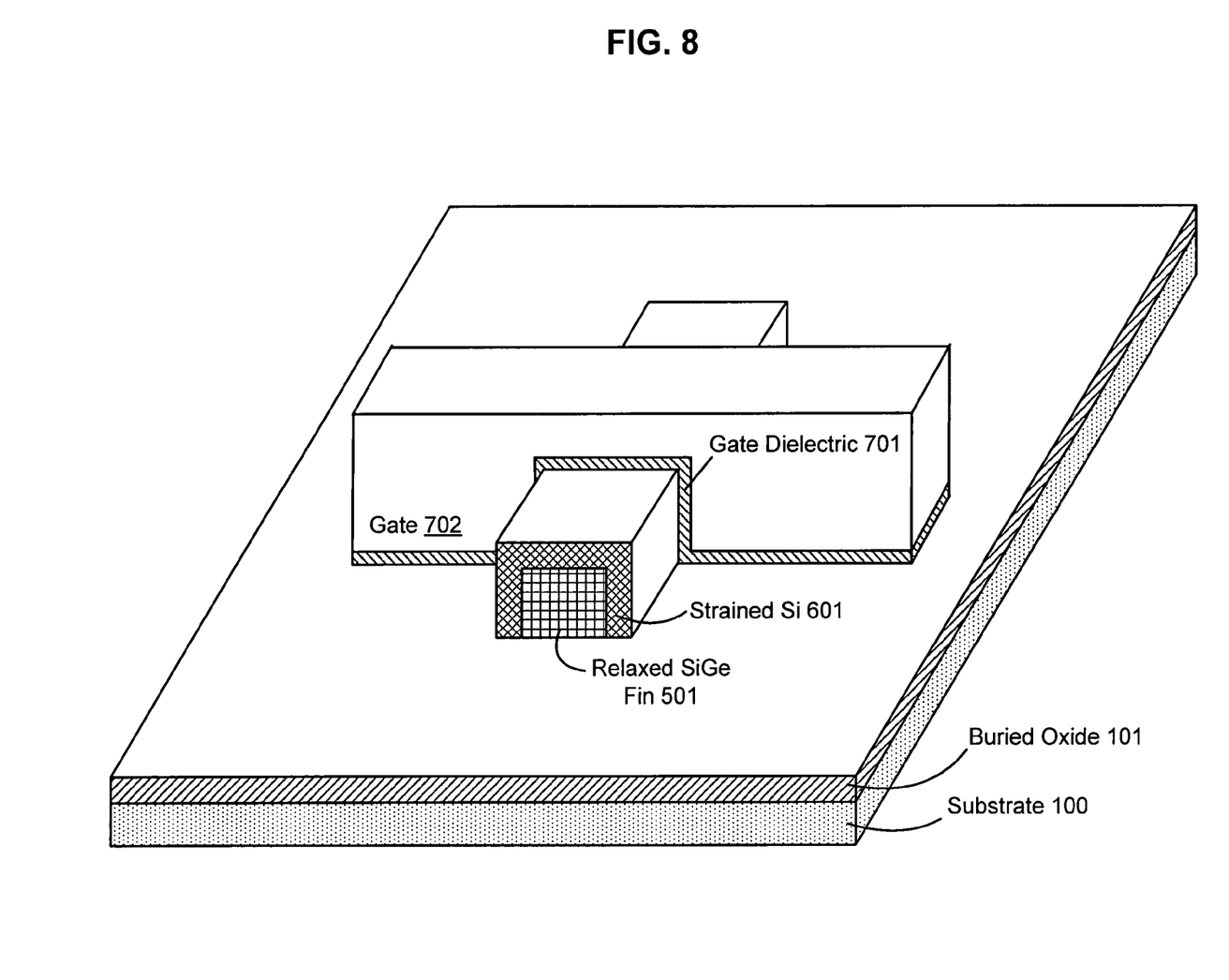
FIG. 8: illustration of a perspective view of the substrate of FIG. 7

FIG. 8 is an illustration of a perspective view of the substrate 100 of FIG. 7 including buried oxide 101, relaxed silicon germanium fin 501, strained silicon 601, gate dielectric 701 and gate 702. In an embodiment, the blanket deposition of gate dielectric 701 and gate 702 have been etched to expose the relaxed silicon germanium fin 501 as described above. It is to be understood that one relaxed silicon germanium fin 501 can operate for many gates 702 and one gate 702 may operate with many relaxed silicon germanium fins 501 to create an array of non-planar, tri-gate MOS transistors.

Figure 9:
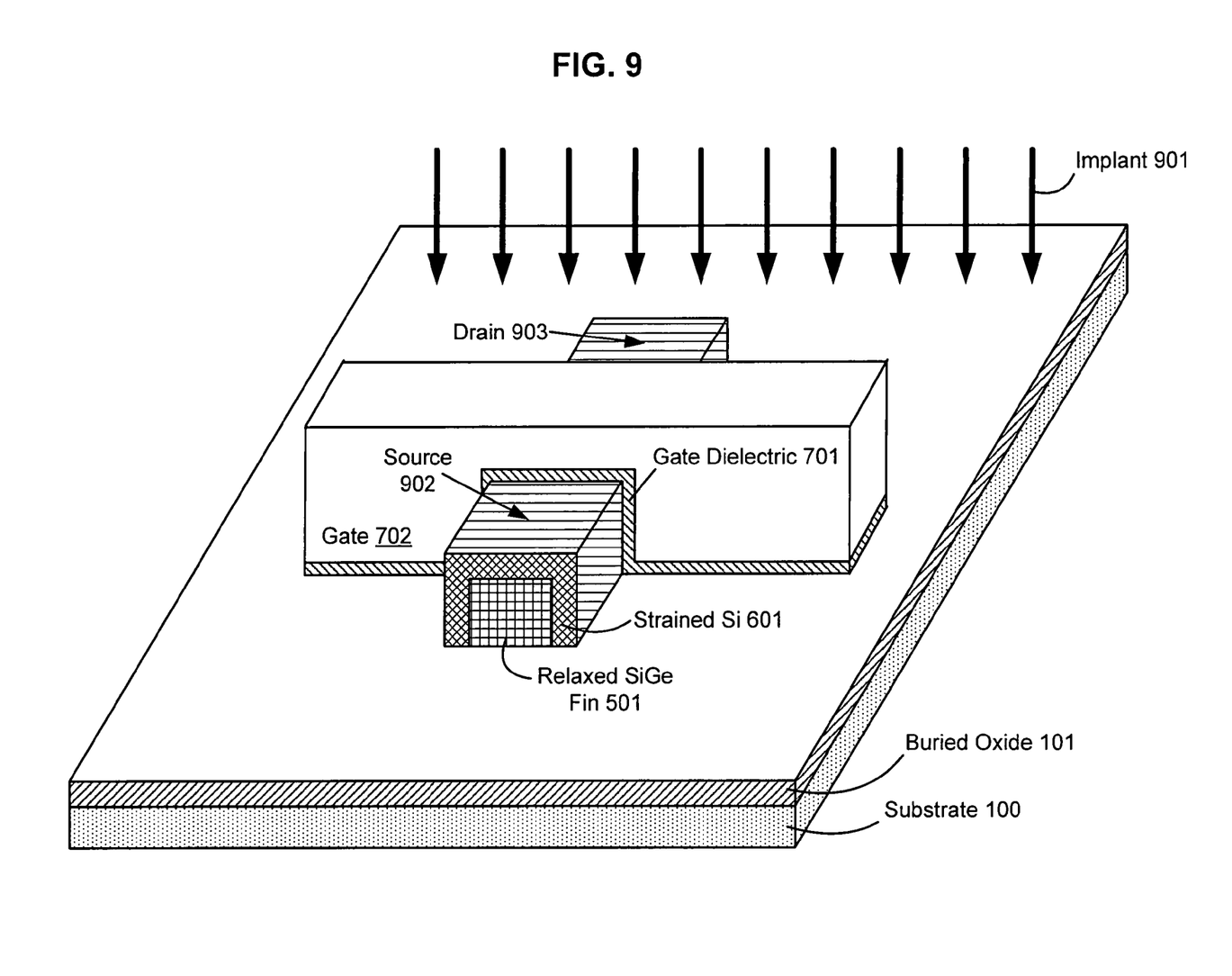
FIG. 9: illustration of the perspective view of FIG. 8 following an implant to form source and drain regions

FIG. 9 is an illustration of the perspective view of FIG. 8 including an implant 901 to form a source 902 and a drain 903. Well known in the art to form a source and drain for a MOS transistor, the implant 901 (e.g., an n-type dopant implant for an NMOS device) further decreases the contact resistivity between both the source 902 and drain 903 with subsequently fabricated metal contacts to improve the performance of the non-planar, tri-gate MOS transistor of an embodiment.

The resulting structure of an embodiment is a non-planar, tri-gate MOS transistor that includes a strained silicon 601 channel. As noted, the tensile strain on the strained silicon 601 lattice increases the electron and hole mobility within the strained silicon 601 lattice to fabricate an NMOS device with improved performance characteristics. Further, in an embodiment, the strained silicon 601 thickness permits deeply depleted or fully depleted conditions to mitigate leakage current while the NMOS device is in an off state (i.e., enhancement mode with zero gate voltage).

One skilled in the art will recognize the elegance of an embodiment as it combines a non-planar MOS transistor structure with a strained channel material to improve transistor performance.

What is claimed is:

1. A non-planar transistor comprising:
   a silicon germanium body with a top and two sidewalls formed on a substrate and electrically isolated from the substrate;
   a doped strained silicon film formed on the sidewalls of the silicon germanium body;
   a gate dielectric formed on the strained silicon film;
   a gate formed on the gate dielectric; and
   a source and a drain formed in the strained silicon.

2. The non-planar transistor of claim 1, the silicon germanium body comprising a germanium concentration of approximately between 5% and 80%.

3. The non-planar transistor of claim 2, the silicon germanium body comprising a germanium concentration of approximately 150%.

4. The non-planar transistor of claim 1, the gate dielectric comprising a material selected from the group consisting of silicon dioxide, hafnium oxide, hafnium silicate, lanthanum oxide, lanthanum aluminate, zirconium oxide, zirconium silicate, tantalum oxide, titanium oxide, barium strontium titanate, barium titanate, strontium titanate, yttrium oxide, aluminum oxide, lead scandium tantanate, and lead zinc niobate.

5. The non-planar transistor of claim 1, the gate comprising a material selected from the group consisting of polysilicon, metal, and a combination thereof.

6. The non-planar transistor of claim 1 wherein the silicon germanium body has a substantially rectangular cross section and the doped strained silicon film is formed on a the top and both sidewalls of the silicon germanium body.

7. The non-planar transistor of claim 1 wherein the silicon germanium body has a substantially trapezoidal cross section and the doped strained silicon film is formed on a the top and both sidewalls of the silicon germanium body.

8. The non-planar transistor of claim 1 wherein the doped strained silicon film has a thickness of approximately between 2 nanometers and 10 nanometers.

9. The non-planar transistor of claim 8 wherein the doped strained silicon film has a thickness of approximately between 4 nanometers and 5 nanometers.

10. A tri-gate transistor comprising:
    a silicon germanium fin formed on an insulator, the silicon germanium fin including a top surface and two sidewall surfaces;
    a doped strained silicon film formed on the top surface and two sidewall surfaces of the silicon germanium fin;
    a gate dielectric formed on the strained silicon film;

a gate formed on the gate dielectric wherein the gate extends over the top surface of the silicon germanium fin; and a source and a drain formed in the strained silicon film.

11. The tri-gate transistor of claim 10, the silicon germanium fin comprising a germanium concentration of approximately between 5% and 80%.

12. The tri-gate transistor of claim 11, the silicon germanium fin comprising a germanium concentration of approximately 15%.

13. The tri-gate transistor of claim 10 wherein the strained silicon film has a thickness of approximately between 2 nanometers and 10 nanometers.

14. The tri-gate transistor of claim 13 wherein the strained silicon film has a thickness of approximately between 4 nanometers and 5 nanometers.

15. The tri-gate transistor of claim 10 wherein the silicon germanium fin is doped.

16. The tri-gate transistor of claim 15 wherein the silicon germanium fin is doped with a p-dopant concentration of between approximately undoped and $6*10^{19}$ cm$^{-3}$.

17. The tri-gate transistor of claim 10 wherein the strained silicon is doped with a p-dopant concentration of between approximately undoped and $6*10^{19}$ cm$^{-3}$.

18. A non-planar transistor comprising:
a silicon germanium body with a top and two sidewalls formed on a substrate and electrically isolated from the substrate, the silicon germanium body comprising a silicon germanium layer interdiffused with a silicon layer such that the silicon layer has a substantially uniform germanium concentration;

a strained silicon film formed on the sidewalls of the silicon germanium body;

a gate dielectric formed on the doped strained silicon film;

a gate formed on the gate dielectric; and a source and a drain formed in the doped strained silicon film.

19. The non-planar transistor of claim 18 wherein the silicon germanium body has a substantially rectangular cross section and the strained silicon film is formed on the top and both sidewalls of the silicon germanium body.

20. The non-planar transistor of claim 18 wherein the silicon germanium body is doped.

21. The non-planar transistor of claim 20 wherein the silicon germanium body is doped with a p-dopant concentration of between approximately undoped and $6*10^{19}$ cm$^{-3}$.

22. The non-planar transistor of claim 18 wherein the strained silicon film is doped.

23. The non-planar transistor of claim 22 wherein the strained silicon film is doped with a p-dopant concentration of between approximately undoped and $6*10^{19}$ cm$^{-3}$.

* * * * *